(12) United States Patent
Miyoshi et al.

(10) Patent No.: US 6,480,875 B1
(45) Date of Patent: *Nov. 12, 2002

(54) ADDER CIRCUIT AND ASSOCIATED LAYOUT STRUCTURE

(75) Inventors: Akira Miyoshi; Hiroaki Yamamoto; Yoshito Nishimichi, all of Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/957,159

(22) Filed: Oct. 24, 1997

(30) Foreign Application Priority Data

Oct. 29, 1996 (JP) ................................ 8-286357

(51) Int. Cl.[7] ................................................. G06F 7/50
(52) U.S. Cl. ....................................... 708/702; 708/710
(58) Field of Search ....................... 364/784.01, 784.02, 364/784.03, 784.04, 784.05, 786.01, 787.01, 787.02, 787.03, 787.04, 788

(56) References Cited

U.S. PATENT DOCUMENTS

| 4,882,698 A | * | 11/1989 | Young | 364/787.01 X |
| 5,027,311 A | | 6/1991 | Zion | 364/788 |
| 5,043,934 A | | 8/1991 | Lamb | 364/787.04 |
| 5,581,497 A | * | 12/1996 | Kumar | 364/787.02 |

* cited by examiner

*Primary Examiner*—Chuong Dinh Ngo
(74) *Attorney, Agent, or Firm*—McDermott, Will & Emery

(57) ABSTRACT

In an adder circuit, a block carry generation logic over three consecutive digits is produced from the following equations.

$$G0 = g2 + p2 \cdot g1 + p2 \cdot p1 \cdot g0$$

$$/g0 = /p2 + /g2 \cdot /p1 + /g2 \cdot /g1 \cdot /g0$$

In other words, the block carry generation logic /G0 is produced by a single PMOS transistor, a series circuit formed of two PMOS transistors connected in series, and a series circuit formed of three PMOS transistors connected in series. The block carry generation logic G0 is produced by a single NMOS transistor, a series circuit formed of two NMOS transistors connected in series, and a series circuit formed of three NMOS transistors connected in series. Block carry generation logics can be formed in such a way as to achieve not only a reduction of the layout area but also a higher operation rate.

13 Claims, 10 Drawing Sheets

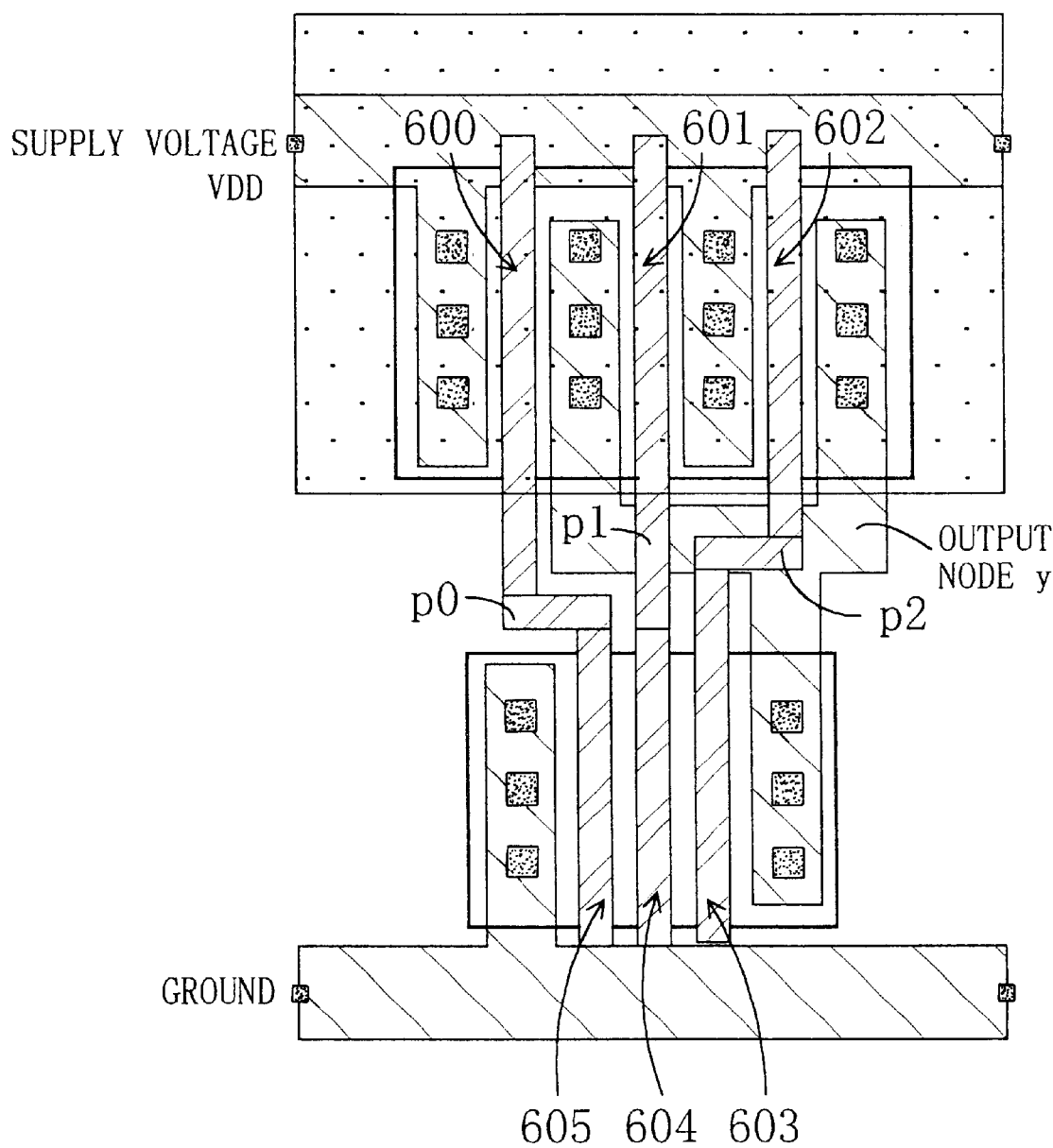

ADDER CIRCUIT AND ASSOCIATED LAYOUT STRUCTURE

BACKGROUND OF THE PRESENT INVENTION

The present invention relates to an improvement in the adder circuits suitable for LSIs as well as to an improvement in the layout structure of such adder circuits.

In recent years, LSIs have improved in the rate of operation as well as in the level of integration of elements. The speed-up of addition operations in the adder circuits is a great contribution to increasing the rate of LSI operation. Various schemes to implement fast addition operations have been proposed. For instance, adder circuits have been known in the art which employ a carry look ahead (CLA) circuit, one example of which is described below.

In a commonly-used adder circuit having a CLA circuit, at the time two numbers which contain a plurality of digits are added together a carry generation logic gi and a carry propagation logic pi are defined for every i digits, and a block carry propagation logic producing circuit capable of producing a block carry propagation logic and a block carry generation logic producing circuit capable of producing a block carry generation logic are formed by arrangement of gi and pi over a plurality of digits (bits). For example, when an addition operation of numbers A and B formed of n digits is performed, each digit's carry generation and propagation logics gi and pi are given by the following equations.

$$pi = Ai + Bi$$

$$gi = Ai \cdot Bi$$

Hereinafter, these operators "+", "·", and "/" designate logical add, logical product, and logical inversion, respectively. A block carry generation logic G0 over three digits from digit $2^0$ to digit $2^2$ is given by the following equation.

$$G0 = g2 + p2 \cdot g1 + p2 \cdot p1 \cdot g0 \qquad (a)$$

If this logic G0 is constructed using CMOS circuits, then a structure, shown in FIG. 7, is obtained.

Referring to FIG. 7, whereas 501–506 are p-type metal-oxide-semiconductor (PMOS) transistors, 507–512 are n-type metal-oxide-semiconductor (NMOS) transistors. The source, gate, and drain of PMOS transistor 501 are coupled to VDD (the supply voltage), to the input g2, and to the sources of PMOS transistors 502 and 503, respectively. The gate and drain of PMOS transistor 502 are coupled to the input p2 and to the sources of PMOS transistors 504, 505, and 506, respectively. The gate and drain of PMOS transistor 503 are coupled to the input g1 and to the sources of PMOS transistors 504, 505, and 506, respectively. The gate and drain of PMOS transistor 504 are coupled to the input p1 and to the output node y, respectively. The gate and drain of PMOS transistor 505 are coupled to the input p2 and to the output node y, respectively. The gate and drain of PMOS transistor 506 are coupled to the input go and to the output node y, respectively.

The source, gate, and drain of NMOS transistor 507 are coupled to GND (ground), to the input g2, and to the output node y, respectively. The source, gate, and drain of NMOS transistor 508 are coupled to the drain of NMOS transistor 509, to the input g1, and to the output node y, respectively. The source, gate, and drain of NMOS transistor 509 are coupled to GND, to the input p2, and to the source of NMOS transistor 508, respectively. The source, gate, and drain of NMOS transistor 510 are coupled to the drain of NMOS transistor 511, to the input g0, and to the output node y, respectively. The source, gate, and drain of NMOS transistor 511 are coupled to the drain of NMOS transistor 512, to the input p2, and to the source of NMOS transistor 510, respectively. The source, gate, and drain of NMOS transistor 512 are coupled to GND, to the input p1, and to the source of NMOS transistor 511.

520 is a connection net for PMOS transistors 501, 502, and 503. 521 is a connection net for PMOS transistors 502, 503, 504, 505, and 506.

Referring to FIG. 7, a "0" is applied to the output node y if the NMOS transistor logic is $g2+p2 \cdot g1+p2 \cdot p1 \cdot g0$. In other cases the output node y is placed in the non-drive state.

On the other hand, a "1" is applied to the output node y if the PMOS transistor logic is $/g2 \cdot (/p2+/g1) \cdot (/p2+/p1+/g0)$. In other cases, the output node y is placed in the non-drive state. However, the PMOS transistor logic and the NMOS transistor logic are in a complementary relationship and, as a result, the output node y is driven to "0" or to "1".

A block carry propagation logic P0 over three digits from digit $2^0$ to digit $2^2$ is given by the following equation.

$$P0 = p2 \cdot p1 \cdot p0 \qquad (b)$$

If this logic P0 is constructed using CMOS circuits, then a structure, shown in FIG. 9, is obtained.

Referring now to FIG. 9, whereas 600–602 are PMOS transistors, 603–605 are NMOS transistors. PMOS transistors 600–602 are coupled in parallel with one another. PMOS transistors 600–602 each have a terminal that is coupled to VDD and another terminal that is coupled to the output node y. The gate of PMOS transistor 600 is coupled to the input p0. The gate of PMOS transistor 601 is coupled to the input p1. The gate of PMOS transistor 602 is coupled to the input p2. On the other hand, NMOS transistors 603–605 are coupled in series with one another. The source and drain of NMOS transistor 605 is coupled to GND and to the source of NMOS transistor 604, respectively. The drain of NMOS transistor 604 is coupled to the source of NMOS transistor 603. The drain of NMOS transistor 603 is coupled to the output node y. The gate of NMOS transistor 603 is coupled to the input p2. The gate of NMOS transistor 604 is coupled to the input p1. The gate of NMOS transistor 605 is coupled to the input p0.

Referring to FIG. 8, a diagram as a result of laying out the logic of FIG. 7 is shown. FIG. 10 shows a diagram as a result of laying out the logic of FIG. 9. As can be seen from the logic of FIG. 7, in the PMOS transistor region two PMOS transistors (PMOS transistors 502, 503) are connected in parallel between VDD and the output node y and, in addition, three PMOS transistors (PMOS transistors 504, 505, 506), are also connected in parallel between VDD and the output node y. Because of such arrangement, there is produced the disadvantage that larger source and drain regions are required in the PMOS transistor formation area. This drawback is explained in detail. Referring to the FIG. 8 layout, the drain region of PMOS transistor 501 and each of the source regions of PMOS transistors 502 and 503 are connected together by the connection net 520, and each of the drain regions of PMOS transistors 502 and 503 and the source regions of PMOS transistors 504, 505, and 506 are connected together by the connection net 521. Since these connection nets 520 and 521 are connected with a first-level metallic layer, this requires the provision of contact regions 522 and 523 for establishing connections between the connection nets 520 and 521 and the source or drain regions of the foregoing PMOS transistors. The source or drain region of PMOS transistors extends, resulting in an increase in the capacitance and, and the operation delay increases.

As can be seen by reference to FIG. 7, formed over and under PMOS transistors 502 and 503 that are parallel-connected are PMOS transistors 501, 504, 505, and 506. Accordingly, it becomes necessary to divide an OD (oxide diffusion) region into two regions, namely a region 524 and a region 525. It further becomes necessary to form a free region between the regions 524 and 525. The size of the adder circuit increases by a proportional amount to such a free region.

On the other hand, in the NMOS transistor region two NMOS transistors, i.e., NMOS transistors 508 and 509, are connected in series between GND (ground) and the output node y, and, in addition, three NMOS transistors, i.e., NMOS transistors 510, 511, and 512, are also connected in series between GND and the output node y. This eliminates the need for the provision of connection nets. The foregoing drawback does not occur, accordingly.

As can be seen by making a comparison between the logic shown by Equation (a) and FIG. 7 and the logic shown by Equation (b) and FIG. 9, these logics differ from each other. Accordingly, the sharing of a block carry generation logic producing circuit and a block carry propagation logic producing circuit between these logics is impossible.

SUMMARY OF THE PRESENT INVENTION

Accordingly, it is an object of the present invention to provide an improved adder circuit having a block carry generation logic producing circuit and a block carry propagation logic producing circuit which are small, fast, and mutually sharable, and a layout structure of such an adder circuit.

In order to provide a solution to the above-described problem, the present invention was made paying attention to the following points. If two binary numbers that contain n−1 digits are represented respectively A and B, then the i-th digit's carry propagation and generation logic values pi and gi are expressed by the following equations, respectively. Here, let n>i where the number i is an integer greater than "0".

$$pi = Ai + Bi \qquad (1\text{-}1)$$

$$gi = Ai \cdot Bi \qquad (1\text{-}2)$$

These operators "+", "·", and "/" designate logical add, logical product, and logical inversion, respectively. Using three consecutive digits (i=0, 1, 2) and Equations (1-1) and (1-2), carry generation logic values g0, g1, and g2 are generated from these three consecutive digits and carry propagation logic values p1 and p2 for the two high-order digits of the three consecutive digits are generated. By use of these five logic values g0, g1, g2, p1, and p2, a block carry generation logic value G0 and a block carry propagation logic value P0 both worth of three digits can be expressed by the following equations, respectively.

$$G0 = g2 + p2 \cdot g1 + p2 \cdot p1 \cdot g0 \qquad (2\text{-}1)$$

$$P0 = p2 \cdot p1 \cdot p0 \qquad (2\text{-}2)$$

Since there exists a relationship between pi and gi shown by Equations (1-1) and (1-2), then the following relationships hold.

$$pi = pi + gi \qquad (3\text{-}1)$$

$$gi = pi \cdot gi \qquad (3\text{-}2)$$

If Equation (2-1) is transformed using Equations (3-1) and (3-2), then the following equation (4) is obtained.

$$G0 = g2 + p2 \cdot g1 + p2 \cdot p1 \cdot g0 \qquad (2\text{-}1)$$

$$/G0 = /p2 + /g2 \cdot /p1 + /g2 \cdot /g1 \cdot /g0 \qquad (4)$$

If Equation (2-2) is transformed using Equations (3-1) and (3-2), then the following equations (5-1) and (5-2) are obtained.

$$P0 = p2 + g2 \cdot p1 + g2 \cdot g1 \cdot p0 \qquad (5\text{-}1)$$

$$/P0 = /g2 + /p2 \cdot /g1 + /p2 \cdot /p1 \cdot /p0 \qquad (5\text{-}2)$$

As can be seen from Equations (2-1) and (4), if the terms of the right side of Equation (2-1) are formed by NMOS transistors, then a "0" is applied to the output node y. If the terms of the right side of Equation (4) are formed by PMOS transistors, then a "1" is applied to the output node y. This makes it possible to constitute a CMOS logic of the block carry generation logic value G0. Further, as can be seen by comparison of Equation (2-1) with Equation (4), the logic of the terms of the right side of Equation (4) constructed of PMOS transistors is the same as the logic of the terms of the right side of Equation (2-1) constructed of NMOS transistors and has a logical product of two input values and a logical product of three input values. If the logic, expressed by Equation (4), is laid out, this results in a layout having a series connection constructed of two PMOS transistors and a series connection constructed of three PMOS transistors, whereby the overall PMOS transistor drain area can be reduced.

Additionally, as can be seen by making a comparison between Equations (5-1) and (5-2), the relationship between these Equations is the same as the relationship between Equations (2-1) and (4). If the logic, expressed by Equation (5-2), is laid out, this results in a layout having a series connection constructed of two PMOS transistors and a series connection constructed of three PMOS transistors, whereby the overall PMOS transistor drain area can be reduced.

Further, Equation (2-1) and Equation (5-1) are compared and the comparison result shows that they are identical in logic with each other, and Equation (4) and Equation (5-2) are compared and the comparison result shows that they are identical in logic with each other, from which it follows that the block carry generation logic producing circuit is identical in circuit organization with the block carry propagation logic producing circuit. Circuit sharing becomes feasible. As a result, producing block carry generation and propagation logics can be implemented by changing only input signals.

In accordance with the present invention, Equations (2-1), (4), (5-1), and (5-2) are used and the block carry generation logic G0 and the block carry propagation logic P0 are formed using CMOS circuits.

The present invention provides an adder circuit which is formed employing a plurality of n-type metal-oxide-semiconductor (NMOS) transistors and a plurality of p-type metal-oxide-semiconductor (PMOS) transistors and which performs addition of two numbers, each of said two numbers containing a plurality of digits, said adder circuit including:

a block carry generation logic producing circuit for producing a block carry generation logic, G0, for consecutive n+1 or more digits of said two numbers at the time said two numbers are added together where the number n is any integer equal to or greater than two and for providing said logic G0 at an output node;

said block carry generation logic producing circuit including:

a first block carry generation logic producing section which is formed of said plurality of PMOS transistors and which has a logic that is expressed by the following equation:

$$/g0=/pn+/gn·/pn-1+/gn·/gn-1·/pn-2 +/gn·/gn-1·/gn-2·/pn-3+/gn·/gn-1·/gn-2·/gn-3·/gn-4$$

where the operator "/" designates logical inversion; and a second block carry generation logic producing section which is formed of said plurality of NMOS transistors and which has a logic that is expressed by the following equation:

$$G0=gn+pn·gn-1+pn·pn-1·gn-2 +pn·pn-1·pn-2·gn-3+pn·pn-1·pn-2·pn-3·gn-4$$

It is preferred that said first block carry generation logic producing section includes:

a single PMOS transistor; and a plurality of series circuits, each of said plurality of series circuits being formed of m PMOS transistors connected together in series where the number m is any integer ranging from two up to n+1;

wherein said single PMOS transistor and said series circuits each have a terminal which is coupled to a supply voltage and another terminal which is coupled to said output node and together form a PMOS transistor group in n+1 rows.

The present invention provides an adder circuit which is formed using a plurality of n-type metal-oxide-semiconductor (NMOS) transistors and a plurality of p-type metal-oxide-semiconductor (PMOS) transistors and which performs addition of two numbers, each of said two numbers containing a plurality of digits, said adder circuit including:

a block carry propagation logic producing circuit for producing a block carry propagation logic, P0, for consecutive n+1 or more digits of said two numbers at the time said two numbers are added together where the number n is any integer equal to or greater than two and for providing said logic P0 at an output node;

said block carry propagation logic producing circuit including:

a first block carry propagation logic producing section which is formed of said plurality of PMOS transistors and which has a logic that is expressed by the following equation:

$$/P0=/gn+/pn·/gn-1+/pn·/pn-1·/gn-2 +/pn·/pn-1·/pn-2·/gn-3+/pn·/pn-1·/pn-2·/pn-3·/pn-4$$

where the operator "/" designates logical inversion; and a second block carry propagation logic producing section which is formed of said plurality of NMOS transistors and which has a logic that is expressed by the following equation:

$$P0=pn+gn·pn-1+gn·gn-1·pn-2 +gn·gn-1·gn-2·pn-3+gn·gn-1·gn-2·gn-3·pn-4$$

It is preferred that said first block carry propagation logic producing section includes a single PMOS transistor and a plurality of series circuits, each of said plurality of series circuits being formed of m PMOS transistors connected together in series where the number m is any integer ranging from two up to n+1 wherein said single PMOS transistor and said series circuits each have a terminal which is coupled to a supply voltage and another terminal which is coupled to said output node and together form a PMOS transistor group in n+1 rows.

The present invention provides an adder circuit which is formed using a plurality of n-type metal-oxide-semiconductor (NMOS) transistors and a plurality of p-type metal-oxide-semiconductor (PMOS) transistors and which performs addition of two numbers, each of said two numbers containing a plurality of digits, (a) said adder circuit including:

a block carry generation logic producing circuit for producing a block carry generation logic, G0, for consecutive n+1 or more digits of said two numbers at the time said two numbers are added together where the number n is any integer equal to or greater than two and for providing said logic G0 at an output node; and a block carry propagation logic producing circuit for producing a block carry propagation logic, P0, for consecutive n+1 or more digits of said two numbers at the time said two numbers are added together and for providing said logic P0 at said output node;

wherein:

a logic for producing said logic G0 in said block carry generation logic producing circuit is identical with a logic for producing said logic P0 in said block carry propagation logic producing circuit;

said logic for producing said logic G0 is expressed by the following equations:

$$G0=gn+pn·gn-1+pn·pn-1·gn-2 +pn·pn-1·pn-2·gn-3+pn·pn-1·pn-2·pn-3·gn-4$$

$$/G0=/pn+/gn·/pn-1+/gn·/gn-1·/pn-2 +/gn·/gn-1·/gn-2·/pn-3+/gn·/gn-1·/gn-2·/gn-3·/gn-4$$

where the operator "/" designates logic inversion; and said logic for producing said logic P0 is expressed by the following equations:

$$P0=pn+gn·pn-1+gn·gn-1·pn-2 +gn·gn-1·gn-2·pn-3+gn·gn-1·gn-2·gn-3·pn-4$$

$$/P0=/gn+/pn·/gn-1+/pn·/pn-1·/gn-2 +/pn·/pn-1·/pn-2·/gn-3+/pn·/pn-1·/pn-2·/pn-3·/pn-4$$

where the operator "/" designates logic inversion.

The present invention provides a layout structure for an adder circuit, said adder circuit which is formed using a plurality of metal-oxide-semiconductor (MOS) transistors and which performs addition of two numbers, each of said two numbers containing a plurality of digits, said adder circuit including:

a block carry generation logic producing circuit for producing a block carry generation logic for consecutive n+1 or more digits of said two numbers at the time said two numbers are added together where the number n is any integer equal to or greater than two and for providing said block carry generation logic at an output node;

said block carry generation logic producing circuit including:

a single MOS transistor; and a plurality of series circuits, each of said plurality of series circuits being formed of m MOS transistors connected together in series where the number m is any integer ranging from two up to n+1;

wherein:

said single MOS transistor and said series circuits each have a terminal which is coupled to a supply voltage or to ground and another terminal which is coupled to said output node and together form a MOS transistor group in n+1 rows; and in two series circuits of said plurality of series circuits, one of which is formed of the greatest number of series-connected MOS transistors and the other of which is formed of the second largest number of series-connected MOS transistors, MOS transistors of said two series circuits whose drain regions are coupled to said output node share a drain region.

The present invention provides a layout structure for an adder circuit, said adder circuit which is formed using a plurality of metal-oxide-semiconductor (MOS) transistors and which performs addition of two numbers, each of said two numbers containing a plurality of digits, said adder circuit including:

a block carry propagation logic producing circuit for producing a block carry propagation logic for consecutive n+1 or more digits of said two numbers at the time said two numbers are added together where the number n is any integer equal to or greater than two and for providing said block carry propagation logic at an output node;

said block carry propagation logic producing circuit including:

a single MOS transistor; and a plurality of series circuits, each of said plurality of series circuits being formed of m MOS transistors connected together in series where the number m is any integer ranging from two up to n+1;

wherein:

said single MOS transistor and said series circuits each have a terminal which is coupled to a supply voltage or to ground and another terminal which is coupled to said output node and together form a MOS transistor group in n+1 rows; in two series circuits of said plurality of series circuits, one of which is formed of the greatest number of series-connected MOS transistors and the other of which is formed of the second largest number of series-connected MOS transistors, MOS transistors of said two series circuits whose drain regions are coupled to said output node share a drain region.

According to the above-described organization, in the adder circuit of the present invention a producing circuit for producing G0 (the block carry generation logic) uses a plurality of PMOS transistors to implement a logic expressed by the following equation.

$$/G0 = /pn + /gn \cdot /pn-1 + /gn \cdot /gn-1 \cdot /pn-2 + /gn \cdot /gn-1 \cdot /gn-2 \cdot /pn-3 + /gn \cdot /gn-1 \cdot /gn-2 \cdot /gn-3 \cdot /gn-4$$

In addition, a producing circuit for producing P0 (the block carry propagation logic) uses a plurality of PMOS transistors to implement a logic expressed by the following equation.

$$/P0 = /gn + /pn \cdot /gn-1 + /pn \cdot /pn-1 \cdot /pn-2 + /pn \cdot /pn-1 \cdot /pn-2 \cdot /gn-3 + /pn \cdot /pn-1 \cdot /pn-2 \cdot /pn-3 \cdot /pn-4$$

Such arrangement permits these PMOS transistors to form series connections each of which is constructed of a predetermined number of PMOS transistors, therefor eliminating the need for providing contact regions for forming connection between OD and metal layer. The drain region area of PMOS transistors can be reduced and the operation delay can be reduced. This achieves a small and fast adder circuit.

In the present adder circuit, the logic of producing a block carry generation logic and the logic of producing a block carry propagation logic are identical with each other. If a block carry generation logic producing circuit is constructed of a plurality of PMOS transistors and a plurality of NMOS transistors, this makes it possible to produce a block carry propagation logic by using such a circuit as it is as a block carry propagation logic producing circuit and by changing input signals to the circuit.

In accordance with a layout structure of an adder circuit of the present invention, in a series circuit that is formed of the largest number of series-connected MOS transistors and in a series circuit that is formed of the second largest number of series-connected MOS transistors, a common drain region is formed in order that in these series circuits MOS transistors with drain regions coupled to the output node may share a drain region. As a result of such arrangement, the drain region area of these MOS transistors can be reduced to a minimum. Delays in the operations can be reduced. This achieves a small and fast adder circuit.

BRIEF DESCRIPTION OF THE DRAWINGS

Preferred embodiments of the present invention are described by making reference to the accompanying drawings in which:

FIG. 10 shows a layout of the conventional 3-digit block carry propagation logic.

DETAILED DESCRIPTION OF THE PRESENT INVENTION

Preferred embodiments of the present invention are described with reference to the accompanying drawings.

First Embodiment

Figure 1:
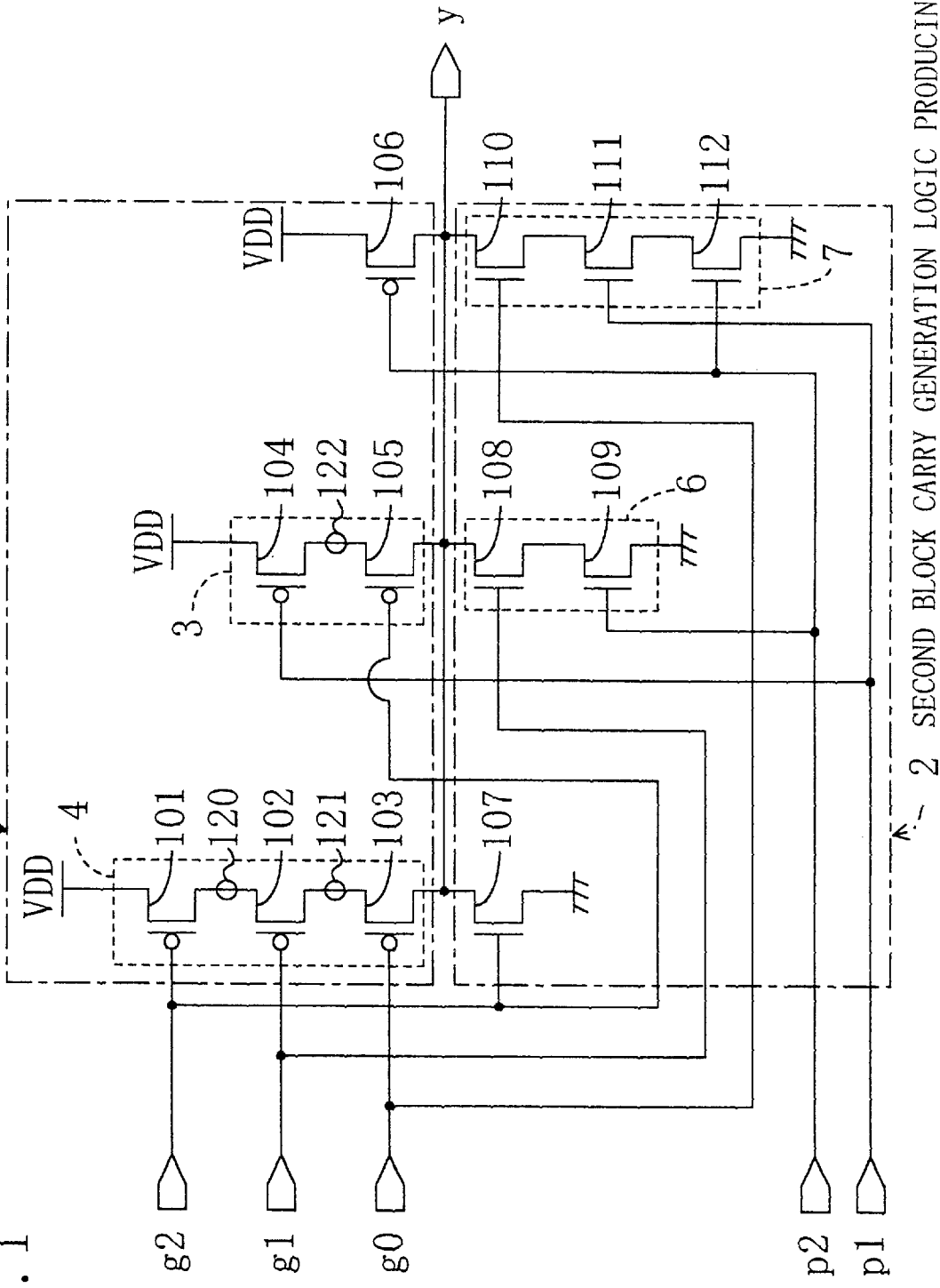
FIG. 1 shows a 3-digit block carry generation logic of an adder circuit in accordance with the present invention.

FIG. 1 shows a 3-digit (n+1 digits where n=2) block carry generation logic producing circuit of an adder circuit formed in accordance with the present invention.

Referring to FIG. 1, 1 is a first block carry generation logic producing section and 2 is a second block carry generation logic producing section. The section 1 has a PMOS transistor 106, a series circuit 3 formed of two PMOS transistors 104 and 105 connected together in series, and a series circuit 4 formed of three PMOS transistors 101, 102, and 103 connected together in series. On the other hand, the section 2 has an NMOS transistor 107, a series circuit 6 formed of two NMOS transistors 108 and 109 connected together in series, and a series circuit 7 formed of three NMOS transistors 110, 111, and 112 connected together in series. A group of MOS transistors in three rows (n+1 where n=2) is formed.

The first block carry generation logic producing section 1 is first described. The source, gate, and drain of PMOS transistor 101 In the series circuit 4 are coupled to VDD (supply voltage), to the input g2, and to the source of PMOS transistor 102, respectively. The source, gate, and drain of PMOS transistor 102 are coupled to the drain of PMOS transistor 101, to the input g1, and to the source of PMOS transistor 103, respectively. The source, gate, and drain of PMOS transistor 103 are coupled to the drain of PMOS transistor 102, to the input g0, and to the output node y, respectively. The source, gate, and drain of PMOS transistor 104 of the series circuit 3 are coupled to VDD, to the input p1, and to the source of PMOS transistor 105, respectively. The source, gate, drain of PMOS transistor 105 are coupled to the drain of PMOS transistor 104, to the input g2, and to the output node y, respectively. The source, gate, drain of PMOS transistor 106 are coupled to VDD, to the input p2, and to the output node y, respectively.

In the section 2, the source, gate, and drain of NMOS transistor 107 are coupled to GND, to the input g2, and to the output node y, respectively. The source, gate, and drain of NMOS transistor 108 of the series circuit 6 are coupled to the drain of NMOS transistor 109, to the input g1, and to the output node y, respectively. The source, gate, and drain of NMOS transistor 109 are coupled to GND, to the input p2, and to the source of NMOS transistor 108, respectively. The source, gate, and drain of NMOS transistor 110 of the series circuit 7 are coupled to the drain of NMOS transistor 111, to the input g0, to the output node y, respectively. The source, gate, and drain of NMOS transistor 111 are coupled to the drain of NMOS transistor 112, to the input p1, and to the source of NMOS transistor 110, respectively. The source, gate, and drain of NMOS transistor 112 are coupled to GND, to the input p2, and to the source of NMOS transistor 111, respectively.

Referring to FIG. 1, 120 is a connection net for PMOS transistors 101 and 102. 121 is a connection net for PMOS transistors 102 and 103. 122 is a connection net for PMOS transistors 104 and 105.

The above-noted inputs g0, g1, g2, p1, and p2 are now described below. Whereas the inputs g0, g1, and g2 are carry generation logic values generated respectively from three consecutive digits, the inputs p1 and p2 are carry propagation values generated from the two high-order ones of the three consecutive digits.

In accordance with the present embodiment, in the following equations (2-1) and (4):

$$G0 = g2 + p2 \cdot g1 + p2 \cdot p1 \cdot g0 \quad (2\text{-}1)$$

$$/G0 = /p2 + /g2 \cdot /p1 + /g2 \cdot /g1 \cdot /g0 \quad (4)$$

where in the right side of Equation (2-1) "g2" is the first term, "p2·g1" the second term and "p2·p1·g0" the third term and in the right side of Equation (4) "/p2" is the first term, "/g2·/p1" the second term and "/g2·/g1·/g0" the third term. In FIG. 1, the first, second, and third terms of the right side of Equation (2-1) are implemented by a single NMOS transistor (i.e., NMOS transistor 107), by two NMOS transistors (NMOS transistors 108 and 109 of the series circuit 6), and by three NMOS transistors (NMOS transistors 110, 111, and 112 of the series circuit 7), respectively. On the other hand, the first, second, and third terms of the right side of Equation (4) are implemented by a single PMOS transistor (i.e., PMOS transistor 106), by two PMOS transistors (PMOS transistors 104 and 105 of the series circuit 3), and by three PMOS transistors (PMOS transistors 101, 102, and 103 of the series circuit 4), respectively. This shows that the value of the output node y is equivalent to G0 or /G0.

Comparison made between Equations (2-1) and (4) shows that these equations are mutually the same logic. Each of these equations (2-1) and (4) is formed of the logical add of a single input, a logical product of two inputs, and a logical product of three inputs. Therefore, the section 1 forming Equation 4 is identical in organization with the section 2 forming Equation (2-1), as shown in FIG. 1. In the series circuit 3, the input p1 is coupled to PMOS transistor 104 and the input g2 is coupled to PMOS transistor 105. However, it may be arranged such that the input p1 is coupled to PMOS transistor 105 and the input g2 is coupled to PMOS transistor 104 because the forgoing logics are the same even when such a change in the input is made. This is applied to the other series circuits 4, 6, and 7.

Figure 2:
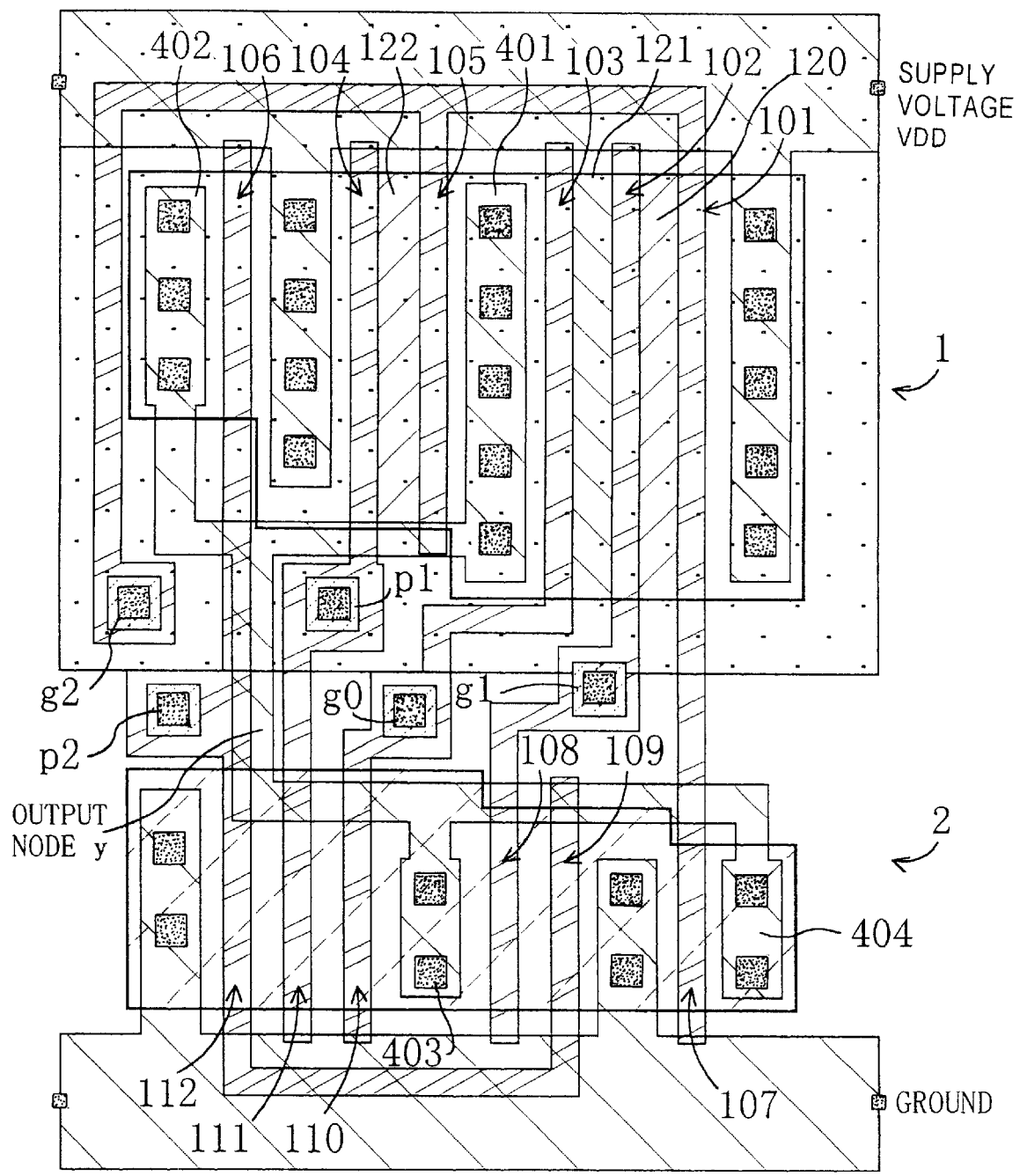
FIG. 2 shows a layout of the 3-digit block carry generation logic.
Figure 8:
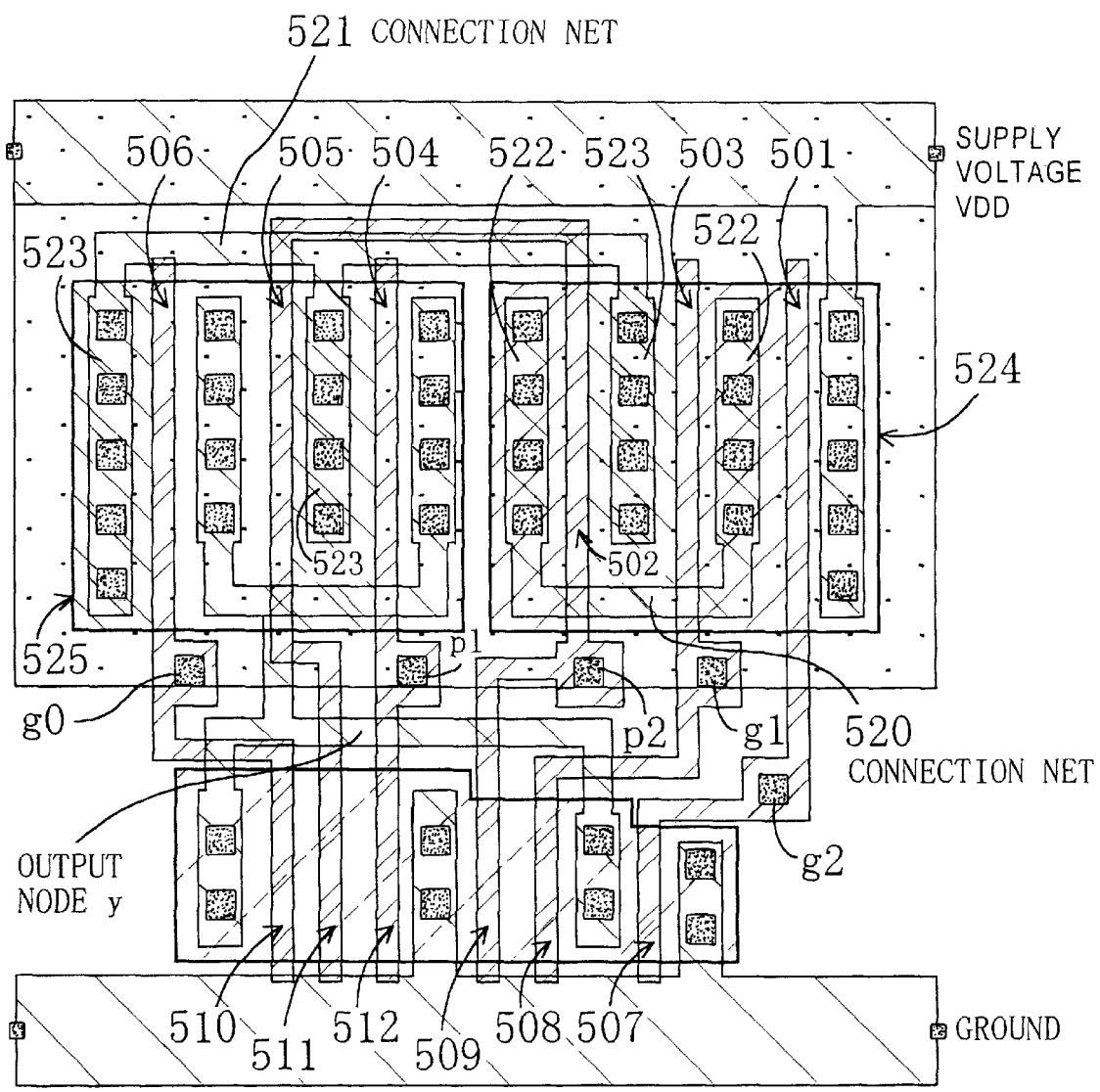
FIG. 8 shows a layout of the conventional 3-digit block carry generation logic.
Figure 9:
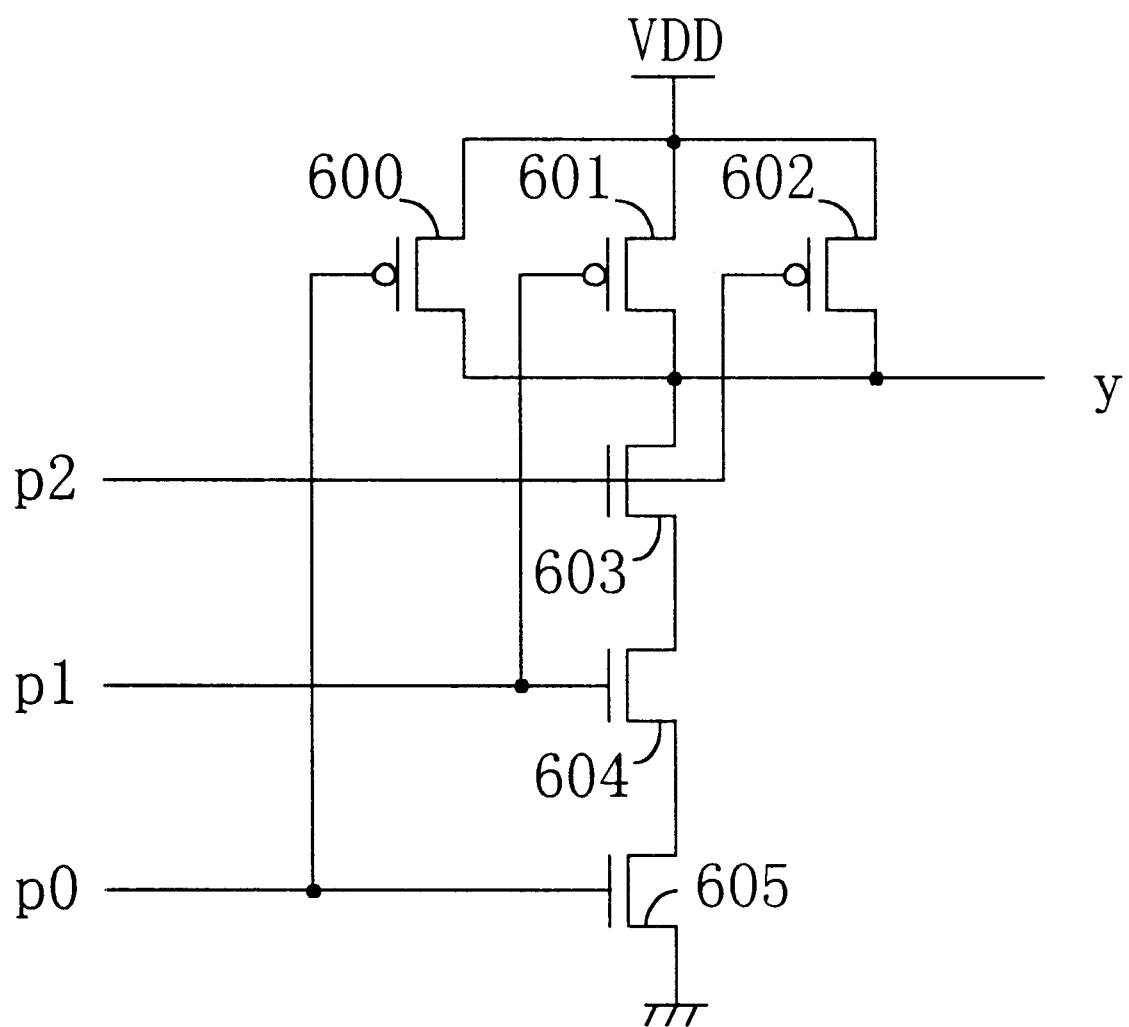
FIG. 9 shows a 3-digit block carry propagation logic in accordance with a prior art technique.

FIG. 2 shows a layout of Equations (2-1) and (4). The region for the connection nets 120, 121, and 122 becomes a region of FIG. 2. This produces some advantages over a prior art technique's example of FIG. 8. For example, there is no need of connection nets and a considerable area reduction is achieved. Accordingly, the drain capacitance can be reduced by a proportional amount to a reduction of the drain region. The output capacitance of the output node y coupled to the drain region can be reduced, whereby fast charging/discharging can be achieved and fast addition operations can be performed.

In accordance with this embodiment, the three PMOS transistors 101, 102, and 103 are series-connected and the two PMOS transistors 104 and 105 are series-connected in the first block carry generation logic producing section 1. As a result, there is no need of forming, in a transistor drain region, a contact region for establishing connection between the OD and the first-level metal layer (see FIG. 8). This makes it possible to reduce a PMOS transistor's drain region and to reduce the output capacitance thereof. As a result, delays in the operations of the adder circuit containing therein the section 1 can be diminished. This provides adder circuits which require a less circuit area and have the ability to operate at high speed.

Figure 3:
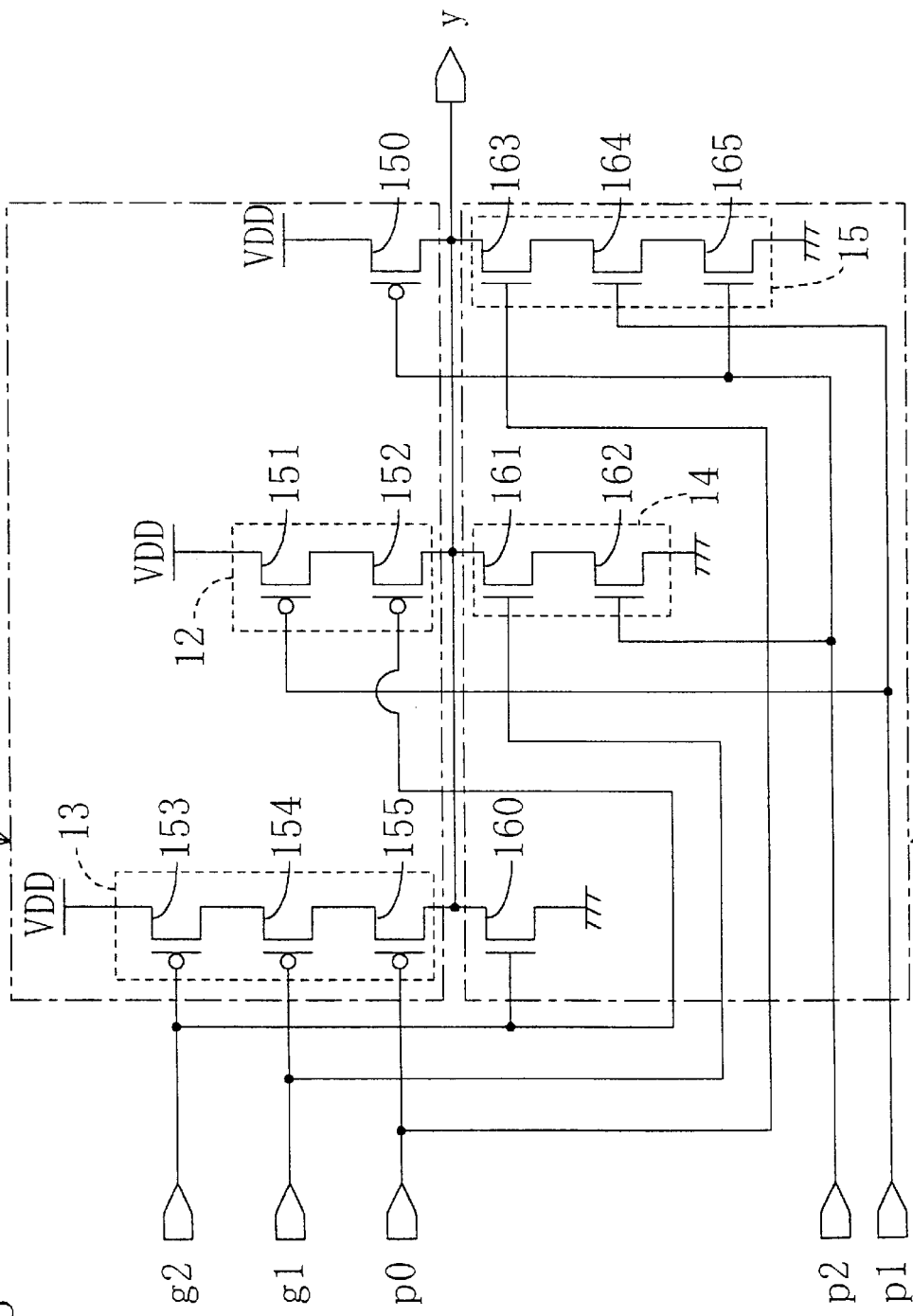
FIG. 3 shows a 3-digit block carry propagation logic of the adder circuit.

FIG. 3 illustrates a block carry propagation logic producing circuit. As can be seen from Equations (5-1) and (5-2), the block carry propagation logic P0 is identical with the logic of Equations (2-1) and (4). Therefore, the block carry propagation logic producing circuit of FIG. 2 is identical in organization with the block carry generation logic producing circuit of FIG. 1.

Referring to FIG. 3, a first block carry propagation logic producing section 10 is formed of a group of PMOS transistors arranged in three rows, in other words the unit 10 has a PMOS transistor 150, a series circuit 12 of two series-connected PMOS transistors 151 and 152, and a series circuit 13 of three series-connected PMOS transistors 153, 154, and 155. On the other hand, a second block carry propagation logic producing section 11 is formed of a group of NMOS transistors arranged in three rows, in other words the unit 11 has an NMOS transistor 160, a series circuit 14 of two series-connected NMOS transistors 161 and 162, and a series circuit 15 of three series-connected NMOS transistors 163, 164, and 165.

The block carry propagation logic producing circuit of FIG. 3 is different in input from the block carry generation logic producing circuit of FIG. 1. That is, the gate of PMOS transistor 150 is coupled to the input g2. The gates of PMOS transistors 151 and 152 of the series circuit 12 are coupled to the inputs g1 and p2, respectively. The gates of PMOS transistors 153, 154, and 155 of the series circuit 13 are coupled to the inputs p2, p1, and p0, respectively. The gate of NMOS transistor 160 is coupled to the input p2. The gates of NMOS transistors 161 and 162 of the series circuit 14 are coupled to the inputs p1 and g2, respectively. The gates of NMOS transistors 163, 164, and 165 of the series circuit 15 are coupled to the input p0, g1, and g2, respectively.

Figure 4:
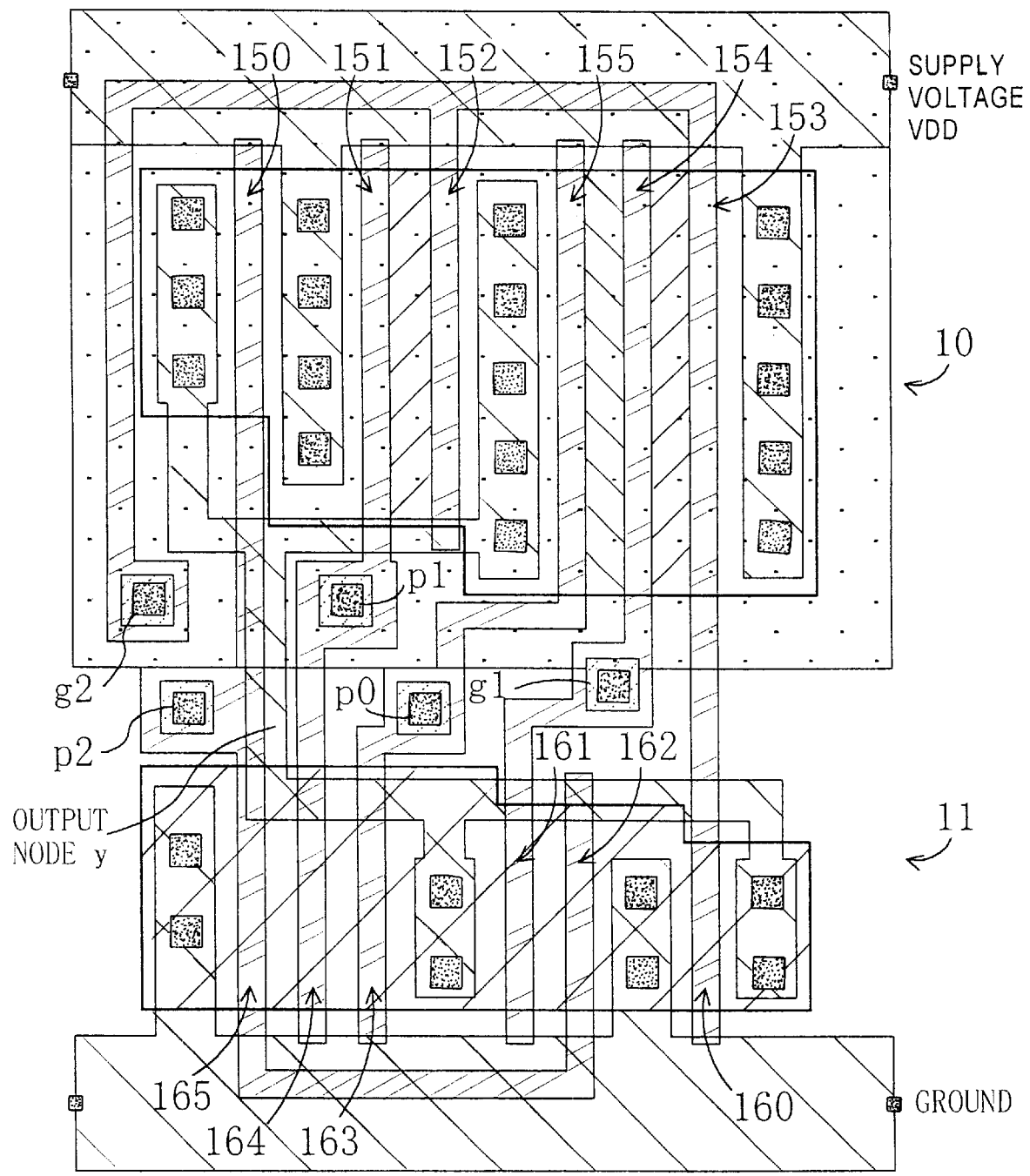
FIG. 4 shows a layout of the 3-digit block carry propagation logic.

As can be seen from the foregoing description, the block carry propagation logic producing circuit of FIG. 3 is identical in organization with the block carry generation logic producing circuit of FIG. 1 and has the ability to produce P0 and /P0 by changing input signals. FIG. 4 is a result of laying out the block carry propagation logic shown in FIG. 3. Since the figure is the same as the layout shown in FIG. 2 except for inputs, it is not described here.

Second Embodiment

In the layout of the 3-digit block carry generation logic shown in FIG. 2, a common drain region is formed between specific PMOS transistors. In other words, PMOS transistor 103, coupled to the output node y, of the series circuit 4 formed of the largest number of series-connected PMOS transistors (i.e., three PMOS transistors) and PMOS transistor 105, also coupled to the output node y, of the series circuit 3 formed of the second largest number of series-connected PMOS transistors (i.e., two PMOS transistors) share a drain region. To sum up, a drain region common between PMOS transistor 103 of the series circuit 4 and PMOS transistor 105 of the series circuit 3 in the first block carry generation logic producing section 1 is formed, which is coupled to the output node y. Likewise, in the second block carry generation logic producing unit 2 a common drain region 403 between NMOS transistor 110 of the series circuit 7 and NMOS transistor 108 of the series circuit 6 is formed. This common drain region 403 is coupled to the output node y. Referring to FIG. 2, PMOS transistor 106 has a drain region 402. The drain region 402 is coupled to the output node y. NMOS transistor 107 has a drain region 404. The drain region 404 is coupled to the output node y.

As the number of series-connected MOS transistors increases, the MOS transistor ON resistance likewise increases. In order to increase the MOS transistor drive performance, the transistor width, W, is increased. In FIG. 2, the overall width of the three series-connected MOS transistors, such as PMOS transistors 101–103 and NMOS transistors 110–112), is the greatest. The overall width of the two series-connected MOS transistors, such as PMOS transistors 104 and 105 and NMOS transistors 108 and 109, is the second greatest. The width of the independent MOS transistor, such as PMOS transistor 106 and NMOS transistor 107, is the smallest. The MOS transistor source and drain regions extend with the transistor width.

In accordance with the present embodiment, a common drain region is laid out between the series circuit formed of the greatest numbers of series-connected MOS transistors and the series circuit formed of the second greatest number of series-connected MOS transistors. This arrangement makes it possible to reduce a drain region area to be connected to the output node y. The effects of the present embodiment are explained below.

For the sake of simplicity, suppose that the drain region area of three series-connected MOS transistors is "3", the drain region area of two series-connected MOS transistors is "2", and the drain region area of an independent MOS transistor is "1". The area of the common drain region 401 is "3". The area of the drain region 402 is "1". The area of the common drain region 403 is "3". The area of the drain region 404 is "1". The sum of these drain region areas is "8".

Figure 5:
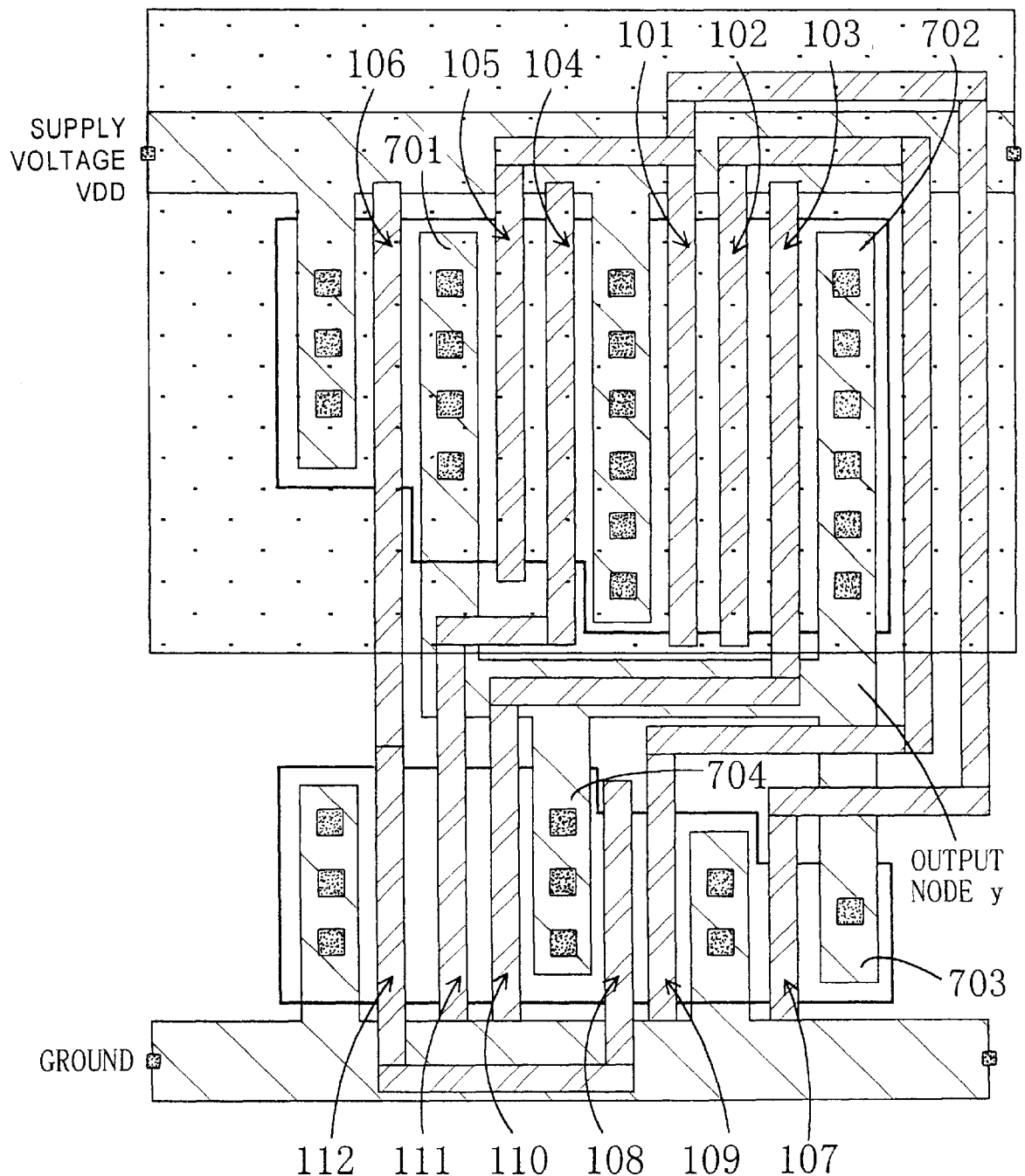
FIG. 5 shows another layout of the 3-digit block carry propagation logic for describing the effect of the layout of FIG. 4.

For comparison, FIG. 5 shows a layout result in which a MOS transistor drain region, which is shared between the series circuits formed of small numbers of series-connected MOS transistors, is formed. In FIG. 5, 701 is a common drain region between PMOS transistor 105 of the series circuit 3 and PMOS transistor 106. This common drain region 701 is coupled to the output node y. On the other hand, 704 is a common drain region between NMOS transistor 108 of the series circuit 6 and NMOS transistor 110 of the series circuit 7. This common drain region 704 is coupled to the output node y. PMOS transistor 103 of the series circuit 4 has a drain region 702. This drain region 702 is coupled to the output node y. NMOS transistor 107 has a drain region 703 coupled to the output node y.

Referring to FIG. 5, the total drain region area is calculated by summing together the area of the drain region 701 which is "2", the area of the drain region 702 which is "3", the area of the drain region 703 which is "1", and the area of the drain region 704 which is "3", and the result is "9".

The above shows that the present embodiment achieves a reduction of the total of the drain areas of the MOS transistors coupled to the output node y. Capacitance existing in the output node y is reduced, thereby making it possible to provide a layout structure for fast adder circuits.

The present invention has been described in terms of 3-digit block carry generation and propagation logics. Same is applied in forming a 4- or more than 4-digit block carry generation and propagation logics.

In general, an (n+1)-digit block carry generation logic G0 is expressed by the following equation.

$$G0 = gn + pn \cdot gn{-}1 + pn \cdot pn{-}1 \cdot gn{-}2 + pn \cdot pn{-}1 \cdot pn{-}2 \cdot gn{-}3 + pn \cdot pn{-}1 \cdot pn{-}2 \cdot pn{-}3 \cdot gn{-}4$$

The above general equation can be expressed as follows.

$$/G0 = /pn + /gn \cdot /pn{-}1 + /gn \cdot /gn{-}1 \cdot /pn{-}2 + /gn \cdot /gn{-}1 \cdot /gn{-}2 \cdot /pn{-}3 + /gn \cdot /gn{-}1 \cdot /gn{-}2 \cdot /gn{-}3 \cdot /pn{-}4$$

From these two equations shown above, a 4-digit block carry generation logic can be expressed by the following equations (6) and (7).

$$G0 = g3 + p3 \cdot g2 + p3 \cdot p2 \cdot g1 + p3 \cdot p2 \cdot p1 \cdot g0 \tag{6}$$

$$/G0 = /p3 + /g3 \cdot /p2 + /p3 \cdot /g2 \cdot /p1 + /g3 \cdot /p2 \cdot /p1 \cdot /g0 \tag{7}$$

Figure 6:
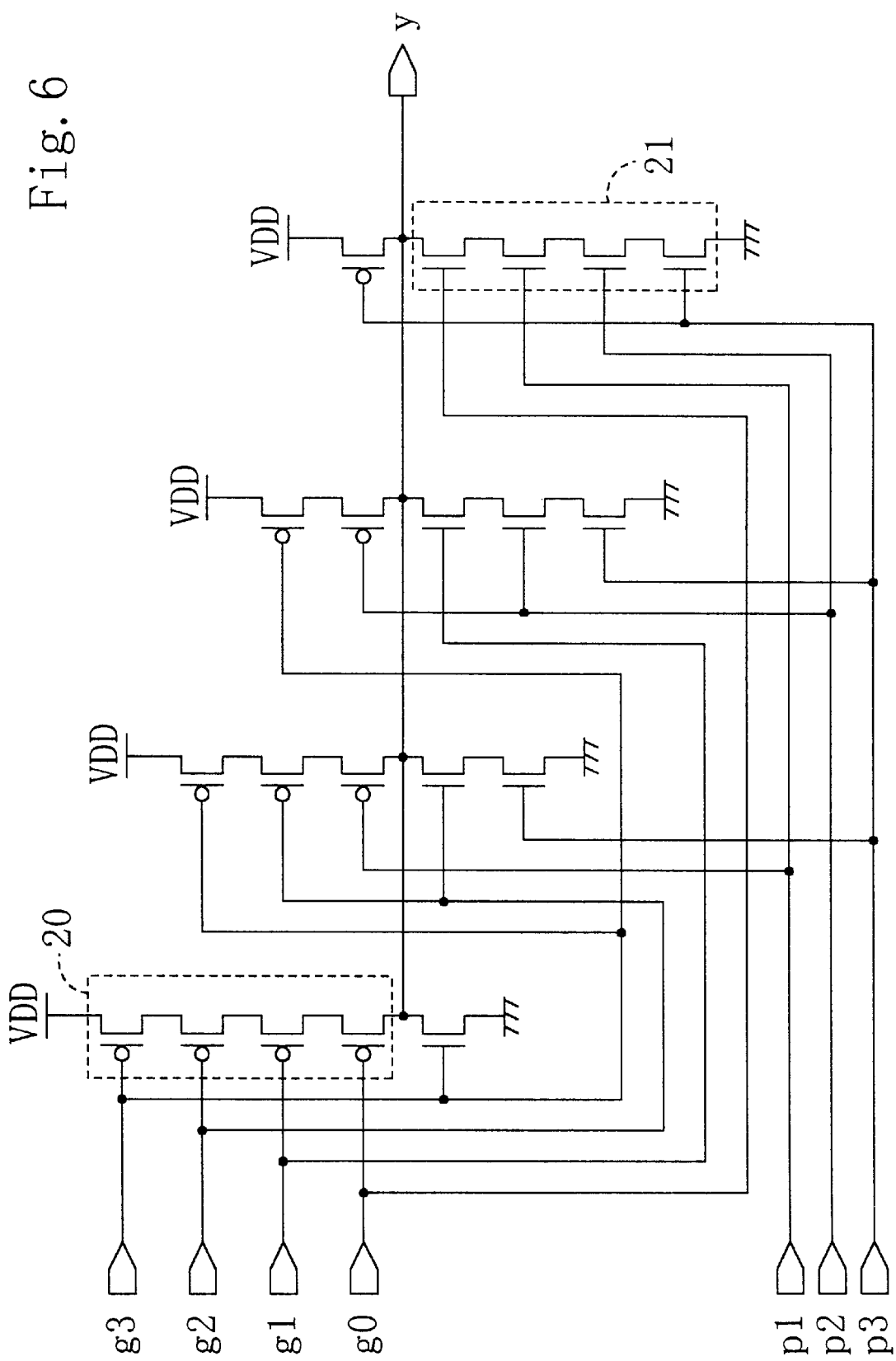
FIG. 6 shows a 4-digit block carry generation logic of the adder circuit in accordance with the present invention.
Figure 7:
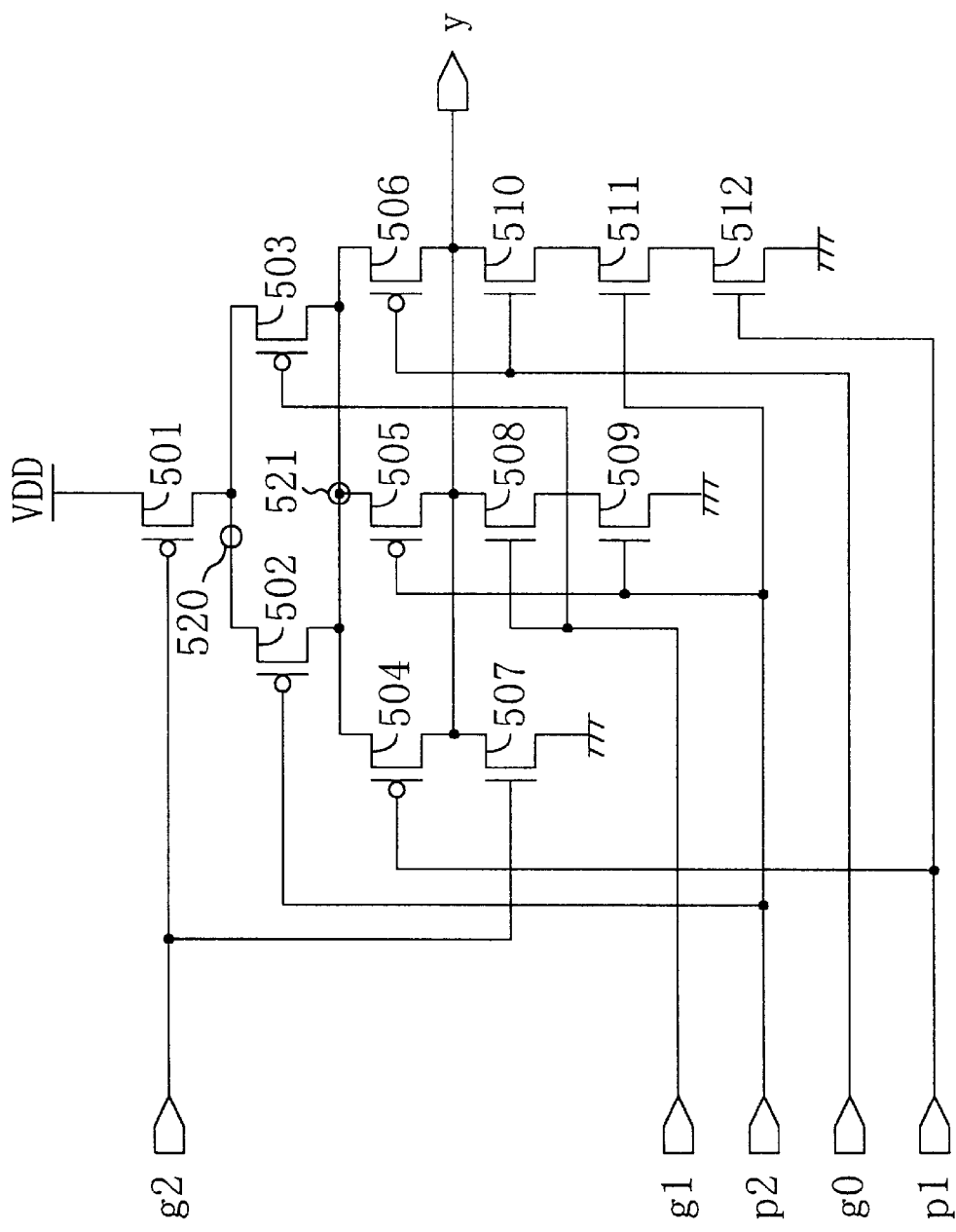
FIG. 7 shows a 3-digit block carry generation logic in accordance with a prior art technique.

Accordingly, what is obtained is a logic formed by addition of a logic, shown in FIG. 6 (i.e., a series circuit 20 of four series-connected PMOS transistors and a series circuit 21 of four series-connected NMOS transistors), and the logic of FIG. 1. However, the independent PMOS transistor, the independent NMOS transistor, and the series circuits receive different input signals.

Generally, an (n+1)-digit block carry propagation logic P0 is expressed by the following equation.

$$P0 = pn + gn \cdot pn{-}1 + gn \cdot gn{-}1 \cdot pn{-}2 + gn \cdot gn{-}1 \cdot gn{-}2 \cdot pn{-}3 + gn \cdot gn{-}1 \cdot gn{-}2 \cdot gn{-}3 \cdot pn{-}4$$

This general equation can be expressed as follows.

$$/P0=/gn+/pn\cdot/gn-1+/pn\cdot/pn-1\cdot/gn-2 +//pn\cdot/pn-1\cdot/pn-2\cdot/gn-3+/pn\cdot/pn-1\cdot/pn-2\cdot/pn-3\cdot/gn-4$$

Even in forming a 4- or more than 4-digit block carry generation or propagation logic, a first block carry generation (or propagation) logic producing section comprised of a plurality of PMOS transistors can be formed having the same structure as a second block carry generation (or propagation) logic producing section comprised of a plurality of NMOS transistors. This makes it possible to achieve, in the first block carry generation (or propagation) logic producing section, a reduction of the PMOS transistor drain capacitance, whereby it can become possible to provide a layout which requires a less area and achieves a higher operation rate.

The invention claimed is:

1. An adder circuit which is formed using a plurality of n-type metal-oxide-semiconductor (NMOS) transistors and a plurality of p-type metal-oxide-semiconductor (PMOS) transistors and which performs addition of two numbers, each of said two numbers containing a plurality of digits,
   (a) said adder circuit including:
      a block carry generation logic producing circuit for producing a block carry generation logic, G0, for consecutive n+1 or more digits of said two numbers at the time said two numbers are added together where the number n is any integer equal to or greater than two and for providing said logic G0 at an output node;
   (b) said block carry generation logic producing circuit including:
      a first block carry generation logic producing section which is formed of said plurality of PMOS transistors and which has a logic that is expressed by the following equation:

$$/G0=/pn+/gn\cdot/pn-1+/gn\cdot/gn-1\cdot/pn-2 +/gn\cdot/gn-1\cdot/gn-2\cdot/pn-3+/gn\cdot/gn-1\cdot/gn-2\cdot/gn-3\cdot/gn-4$$

where the operator "/" designates logical inversion; and
      a second block carry generation logic producing section which is formed of said plurality of NMOS transistors and which has a logic that is expressed by the following equation:

$$G0=gn+pn\cdot gn-1+pn\cdot pn-1\cdot gn-2 +pn\cdot pn-1\cdot pn-2\cdot gn-3+pn\cdot pn-1\cdot pn-2\cdot pn-3\cdot gn-4.$$

2. The adder circuit according to claim 1,
said first block carry generation logic producing section including:
a single PMOS transistor; and
a plurality of series circuits, each of said plurality of series circuits being formed of m PMOS transistors that are connected together in series where the number m is any integer ranging from two up to n+1;
wherein said single PMOS transistor and said series circuits each have a terminal which is coupled to a supply voltage and another terminal which is coupled to said output node and together form a PMOS transistor group in n+1 rows.

3. The adder circuit according to claim 2,
said second block carry generation logic producing section including:
a single NMOS transistor; and
a plurality of series circuits, each of said plurality of series circuits being formed of m NMOS transistors connected together in series where the number m is any integer ranging from two up to n+1;
wherein said single NMOS transistor and said series circuits each have a terminal that is coupled to ground and another terminal that is coupled to said output node and together form an NMOS transistor group in n+1 rows.

4. The adder circuit according to claim 3, wherein said integer n takes the same value in said first and second block carry generation logic producing sections and wherein said integer n=2.

5. An adder circuit which is formed using a plurality of n-type metal-oxide-semiconductor (NMOS) transistors and a plurality of p-type metal-oxide-semiconductor (PMOS) transistors and which performs addition of two numbers, each of said two numbers containing a plurality of digits,
   (a) said adder circuit including:
      a block carry propagation logic producing circuit for producing a block carry propagation logic, P0, for consecutive n+1 or more digits of said two numbers at the time said two numbers are added together where the number n is any integer equal to or greater than two and for providing said logic P0 at an output node;
   (b) said block carry propagation logic producing circuit including:
      a first block carry propagation logic producing section which is formed of said plurality of PMOS transistors and which has a logic that is expressed by the following equation:

$$/P0=/gn+/pn\cdot/gn-1+/pn\cdot/pn-1\cdot/gn-2 +/pn\cdot/pn-1\cdot/pn-2\cdot/gn-3+/pn\cdot/pn-1\cdot/pn-2\cdot/pn-3\cdot/pn-4$$

where the operator "/" designates logical inversion; and
      a second block carry propagation logic producing section which is formed of said plurality of NMOS transistors and which has a logic that is expressed by the following equation:

$$P0=pn+gn\cdot pn-1+gn\cdot gn-1\cdot pn-2 +gn\cdot gn-1\cdot gn-2\cdot pn-3+gn\cdot gn-1\cdot gn-2\cdot gn-3\cdot pn-4.$$

6. The adder circuit according to claim 5,
said first block carry propagation logic producing section including:
a single PMOS transistor; and
a plurality of series circuits, each of said plurality of series circuits being formed of m PMOS transistors connected together in series where the number m is any integer ranging from two up to n+1;
wherein said single PMOS transistor and said series circuits each have a terminal which is coupled to a supply voltage and another terminal which is coupled to said output node and together form a PMOS transistor group in n+1 rows.

7. The adder circuit according to claim 6,
said second block carry propagation logic producing section including:
a single NMOS transistor; and
a plurality of series circuits, each of said plurality of series circuits being formed of m NMOS transistors connected together in series where the number m is any integer ranging from two up to n+1;
wherein said single NMOS transistor and said series circuits each have a terminal that is coupled to ground and another terminal that is coupled to said output node and together form an NMOS transistor group in n+1 rows.

8. The adder circuit according to claim 7, wherein said integer n takes the same value in said first and second block carry propagation logic producing sections and wherein said integer n=2.

9. An adder circuit which is formed using a plurality of n-type metal-oxide-semiconductor (NMOS) transistors and a plurality of p-type metal-oxide-semiconductor (PMOS) transistors and which performs addition of two numbers, each of said two numbers containing a plurality of digits, (a) said adder circuit including:
  a block carry generation logic producing circuit for producing a block carry generation logic, G0, for consecutive n+1 or more digits of said two numbers at the time said two numbers are added together where the number n is any integer equal to or greater than two and for providing said logic G0 at an output node; and
  a block carry propagation logic producing circuit for producing a block carry propagation logic, P0, for consecutive n+1 or more digits of said two numbers at the time said two numbers are added together and for providing said logic P0 at said output node; wherein:
  a logic for producing said logic G0 in said block carry generation logic producing circuit is identical with a logic for producing said logic P0 in said block carry propagation logic producing circuit;
  said logic for producing said logic G0 is expressed by the following equations:

$G0 = gn + pn \cdot gn-1 + pn \cdot pn-1 \cdot gn-2 + pn \cdot pn-1 \cdot pn-2 \cdot gn-3 + pn \cdot pn-1 \cdot pn-2 \cdot pn-3 \cdot gn-4$ $/G0 = /pn + /gn \cdot /pn-1 + /gn \cdot /gn-1 \cdot /pn-2 + /gn \cdot /gn-1 \cdot /gn-2 \cdot /pn-3 + /gn \cdot /gn-1 \cdot /gn-2 \cdot /gn-3 \cdot /gn-4$ where the operator "/" designates logic inversion; and
  said logic for producing said logic PO is expressed by the following equations:

$PO = gn + pn \cdot gn-1 + pn \cdot pn-1 \cdot gn-2 + pn \cdot pn-1 \cdot gn-2 \cdot pn-3 + pn \cdot pn-1 \cdot gn-2 \cdot pn-3 \cdot pn-4$ $/PO = /pn + /gn \cdot /pn-1 + /gn \cdot /gn-1 \cdot /pn-2 + /gn \cdot /gn-1 \cdot /gn-2 \cdot /pn-3 + /gn \cdot /gn-1 \cdot /gn-2 \cdot /gn-3 \cdot /pn-4$ equal to or greater than two and for providing said logic G0 at an output node; and
  a block carry propagation logic producing circuit for producing a block carry propagation logic, P0, for consecutive n+1 or more digits of said two numbers at the time said two numbers are added together and for providing said logic P0 at said output node; wherein:
  a logic for producing said logic G0 in said block carry generation logic producing circuit is identical with a logic for producing said logic P0 in said block carry propagation logic producing circuit;
  said logic for producing said logic G0 is expressed by the following equations:

$G0 = gn + pn \cdot gn-1 + pn \cdot pn-1 \cdot gn-2 + pn \cdot pn-1 \cdot pn-2 \cdot gn-3 + pn \cdot pn-1 \cdot pn-2 \cdot pn-3 \cdot gn-4$ $/G0 = /pn + /gn \cdot /pn-1 + /gn \cdot /gn-1 \cdot /pn-2 + /gn \cdot /gn-1 \cdot /gn-2 \cdot /pn-3 + /gn \cdot /gn-1 \cdot /gn-2 \cdot /gn-3 \cdot /gn-4$ where the operator "/" designates logic inversion; and
  said logic for producing said logic PO is expressed by the following equations:

$PO = pn + gn \cdot pn-1 + gn \cdot gn-1 \cdot pn-2 + gn \cdot gn-1 \cdot gn-2 \cdot pn-3 + gn \cdot gn-1 \cdot gn-2 \cdot gn-3 \cdot pn-4$ $/PO = /gn + /pn \cdot /gn-1 + /pn \cdot /pn-1 \cdot /gn-2 + /pn \cdot /pn-1 \cdot /pn-2 \cdot /gn-3 + /pn \cdot /pn-1 \cdot /pn-2 \cdot /pn-3 \cdot /pn-4$ where the operator "/" designates logic inversion.

10. A layout structure for an adder circuit,
said adder circuit which is formed using a plurality of metal-oxide-semiconductor (MOS) transistors and which performs addition of two numbers, each of said two numbers containing a plurality of digits,
said adder circuit including:
a block carry generation logic producing circuit for producing a block carry generation logic for consecutive n+1 or more digits of said two numbers at the time said two numbers are added together where the number n is any integer equal to or greater than two and for providing said block carry generation logic at an output node;
said block carry generation logic producing circuit including:
a single MOS transistor; and
a plurality of series circuits, each of said plurality of series circuits being formed of m MOS transistors connected together in series where the number m is any integer ranging from two up to n+1;
wherein:
said single MOS transistor and said series circuits each have a terminal which is coupled to a supply voltage or to ground and another terminal which is coupled to said output node and together form a MOS transistor group in n+1 rows; and
in two series circuits of said plurality of series circuits, one of which is formed of the greatest number of series-connected MOS transistors and the other of which is formed of the second largest number of series-connected MOS transistors, MOS transistors of said two series circuits whose drain regions are coupled to said output node share a drain region.

11. The layout structure according to claim 10 wherein said MOS transistor group in n+1 rows is formed of a group of PMOS transistors in n+1 rows and a group of NMOS transistors in n+1 rows.

12. A layout structure for an adder circuit,
said adder circuit which is formed using a plurality of metal-oxide-semiconductor (MOS) transistors and which performs addition of two numbers, each of said two numbers containing a plurality of digits,
said adder circuit including:
a block carry propagation logic producing circuit for producing a block carry propagation logic for consecutive n+1 or more digits of said two numbers at the time said two numbers are added together where the number n is any integer equal to or greater than two and for providing said block carry propagation logic at an output node;
said block carry propagation logic producing circuit including:
a single MOS transistor; and
a plurality of series circuits, each of said plurality of series circuits being formed of m MOS transistors connected together in series where the number m is any integer ranging from two up to n+1;

wherein:

said single MOS transistor and said series circuits each have a terminal which is coupled to a supply voltage or to ground and another terminal which is coupled to said output node and together form a MOS transistor group in n+1 rows;

in two series circuits of said plurality of series circuits, one of which is formed of the greatest number of series-connected MOS transistors and the other of which is formed of the second largest number of series-connected MOS transistors, MOS transistors of said two series circuits whose drain regions are coupled to said output node share a drain region.

13. The layout structure according to claim 12 wherein said MOS transistor group in n+1 rows is formed of a group of PMOS transistors in n+1 rows and a group of NMOS transistors in n+1 rows.

* * * * *